(12) United States Patent
Yeom

(10) Patent No.: US 7,332,427 B2
(45) Date of Patent: Feb. 19, 2008

(54) METHOD OF FORMING AN INTERCONNECTION LINE IN A SEMICONDUCTOR DEVICE

(75) Inventor: Kye-Hee Yeom, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 135 days.

(21) Appl. No.: 11/020,277

(22) Filed: Dec. 27, 2004

(65) Prior Publication Data
US 2005/0142861 A1 Jun. 30, 2005

(30) Foreign Application Priority Data
Dec. 29, 2003 (KR) .................. 10-2003-0099115

(51) Int. Cl.
*H01L 21/4763* (2006.01)
(52) U.S. Cl. .................. 438/622; 438/623; 438/624; 438/627
(58) Field of Classification Search ............. 438/622, 438/623, 624, 627
See application file for complete search history.

(56) References Cited
U.S. PATENT DOCUMENTS

| | | | |
|---|---|---|---|
| 5,998,292 A | 12/1999 | Black et al. | |
| 6,020,236 A | 2/2000 | Lee et al. | |
| 6,583,460 B1* | 6/2003 | Juengling | 257/296 |
| 6,677,231 B1* | 1/2004 | Tsai et al. | 438/624 |
| 6,881,666 B2* | 4/2005 | Kawano | 438/637 |
| 6,972,253 B2* | 12/2005 | Liu et al. | 438/627 |
| 7,033,930 B2* | 4/2006 | Kozhukh et al. | 438/643 |

FOREIGN PATENT DOCUMENTS

| | | |
|---|---|---|
| JP | 10-041389 | 2/1998 |
| JP | 10-116904 | 5/1998 |
| KR | 10-1997-0052486 | 7/1997 |
| KR | 10-1998-0065662 | 10/1998 |
| KR | 10-1999-0069069 | 9/1999 |
| KR | 10-2003-0018746 | 3/2003 |

\* cited by examiner

*Primary Examiner*—Zandra V. Smith
*Assistant Examiner*—Christy Novacek
(74) *Attorney, Agent, or Firm*—Lee & Morse, P.C.

(57) ABSTRACT

A method of forming an interconnection line in a semiconductor device includes forming an interlayer insulating layer on an underlying layer having a lower conductive layer, patterning the interlayer insulating layer to form an opening exposing the lower conductive layer, forming an additional material layer conformally on the underlying layer including the opening, anisotropically etching the additional material layer to form an opening spacer covering a sidewall of the opening, performing a wet etch process using the opening spacer as an etch mask, forming a conductive layer pattern in the opening, and performing a heat treatment on the opening spacer.

22 Claims, 10 Drawing Sheets

METHOD OF FORMING AN INTERCONNECTION LINE IN A SEMICONDUCTOR DEVICE

BACKGROUND OF THE INVENTION

1. Field of the Invention

The present invention relates to a method of fabricating a semiconductor device. More particularly, the present invention relates to a method of forming an interconnection line in a semiconductor device.

2. Description of the Related Art

In order to produce large-scale integration of semiconductor devices, a size of a memory cell is rapidly decreasing. To facilitate this decrease in size, a multi-layered interconnection structure is being employed. Accordingly, a pitch between interconnection lines is decreased so that an aspect ratio of a contact hole for electrically connecting a lower conductive layer with an upper conductive layer is increased.

FIGS. 1 and 2 illustrate cross-sectional views of a conventional method of forming an interconnection line in a semiconductor device.

Referring to FIG. 1, a first interlayer insulating layer 102 is formed on a semiconductor substrate 100. A first photoresist pattern (not shown) having an opening of a predetermined size is formed on the first interlayer insulating layer 102. Using the first photoresist pattern as an etch mask, an exposed portion of the first interlayer insulating layer 102 is anisotropically etched to form a contact hole 104. After forming the contact hole 104, the first photoresist pattern is removed. A native oxide layer formed on a portion of the semiconductor substrate 100 exposed through the contact hole 104 is then removed by wet etching. The wet etching is generally performed using a chemical solution containing hydrogen fluoride (HF). As a result of the wet etching, the first interlayer insulating layer 102 forming a sidewall of the contact hole 104, as well as the native oxide layer formed on the semiconductor substrate 100, is etched. Resultantly, the contact hole 104 has an opening larger than that of the contact hole 104 primarily formed by the anisotropic etching.

After performing the wet etching, a conductive layer, e.g., a polysilicon layer, is formed on the entire surface of the semiconductor substrate 100, thereby filling the contact hole 104. The conductive layer is then processed by chemical mechanical polishing (CMP) until the first interlayer insulating layer 102 is exposed, thereby forming a contact plug 106 in the contact hole 104.

Referring to FIG. 2, a second interlayer insulating layer 108 is formed on the contact plug 106 and the first interlayer insulating layer 102. A second photoresist pattern (not shown) having an opening of a predetermined size is formed on the second interlayer insulating layer 108. Using the second photoresist pattern as an etch mask, the second interlayer insulating layer 108 is etched to form an interconnection line groove 110 therein. After forming the interconnection line groove 110, the second photoresist pattern is removed and a conductive layer, e.g., tungsten (W), is formed to fill the interconnection line groove 110. The conductive layer is then processed by CMP until the second interlayer insulating layer 108 is exposed, so that a metal interconnection line 112 is formed in the second interlayer insulating layer 108, wherein the metal interconnection line 112 electrically contacts an upper surface of the contact plug 106.

In this conventional method of forming an interconnection line in a semiconductor device, the opening of the contact hole 104 is enlarged during the wet etching to remove the native oxide layer, so that an interval between the contact plugs 106 is decreased, as shown in FIG. 1. Therefore, a misalign margin of a photolithography process for forming the metal interconnection line 112 is reduced, so that a bridge may be formed by the metal interconnection line 112, as shown in FIG. 2, between adjacent contact plugs 106.

Further, in a case where the first interlayer insulating layer 102 within the contact hole 104 is excessively etched during the wet etching, adjacent contact plugs 106 may form a short circuit because nodes of the contact plugs 106 are not insulated during the CMP for forming the contact plug 106.

In an effort to solve the foregoing problems, formation of a silicon nitride spacer on sidewalls of the contact hole after formation of the contact hole has been proposed. The silicon nitride spacer is intended to prevent the interlayer insulating layer forming the sidewalls of the contact hole from being etched during the wet etching. Disadvantageously, however, silicon oxide ($SiO_2$), which forms the interlayer insulating layer, has a dielectric constant of about four, while silicon nitride (SiN), which forms the spacer, has a dielectric constant of about nine. Accordingly, when the silicon nitride spacer is formed on the sidewalls of the contact hole and then the contact plug is formed in the contact hole, a loading capacitance between adjacent contact plugs is increased. Too great of a loading capacitance causes a reduction in an operating speed of the semiconductor device. In addition, because the interval between the contact plugs is reduced as the semiconductor devices are trending toward large-scale integration, the loading capacitance is further increased by the silicon nitride spacer.

SUMMARY OF THE INVENTION

The present invention is therefore directed to a method of forming an interconnection line in a semiconductor device, which substantially overcomes one or more of the problems due to the limitations and disadvantages of the related art.

It is a feature of an embodiment of the present invention to provide a method of forming an interconnection line in a semiconductor device that is able to protect an insulating layer, which forms a sidewall of an opening for an interconnection line, by forming an opening spacer in the opening.

It is another feature of an embodiment of the present invention to provide a method of forming an interconnection line in a semiconductor device that is able to prevent a loading capacitance from being increased due to the opening spacer.

At least one of the above and other features and advantages of the present invention may be realized by providing a method of forming an interconnection line in a semiconductor device including forming an interlayer insulating layer on an underlying layer having a lower conductive layer, patterning the interlayer insulating layer to form an opening exposing the lower conductive layer, forming an additional material layer conformally on the underlying layer including the opening, anisotropically etching the additional material layer to form an opening spacer covering a sidewall of the opening, performing a wet etch process using the opening spacer as an etch mask, forming a conductive layer pattern in the opening, and performing a heat treatment on the opening spacer.

The opening may be a dual damascene pattern and the additional material layer may be conformally formed on the underlying layer including the dual damascene pattern. In this case, the conductive layer pattern may be formed of copper. Forming the conductive layer pattern may include forming a conductive layer to fill the dual damascene pattern after performing the wet etch process and planarizing the conductive layer to expose the interlayer insulating layer. In this case, the method may further include forming a diffusion barrier conformally after performing the wet etching.

The interlayer insulating layer may be a dielectric layer having a low dielectric constant. The interlayer insulating layer may be a borophosphosilicate glass (BPSG) layer. The additional material layer may be formed of material layer having a lower etch rate than that of the interlayer insulating layer. The additional material layer may be a silicon nitride layer. The additional material layer may be formed to have a thickness of about 100 Å or less.

In either method, the heat treatment may be performed at a temperature of at least about 700° C. Further, the heat treatment may be performed at a temperature of at least about 700° C. in an oxygen atmosphere.

The opening may be a contact hole or a groove. The conductive layer pattern may be formed of tungsten or polysilicon. Forming the conductive layer pattern may include forming a conductive layer to fill the opening after performing the wet etch process and planarizing the conductive layer to expose the interlayer insulating layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
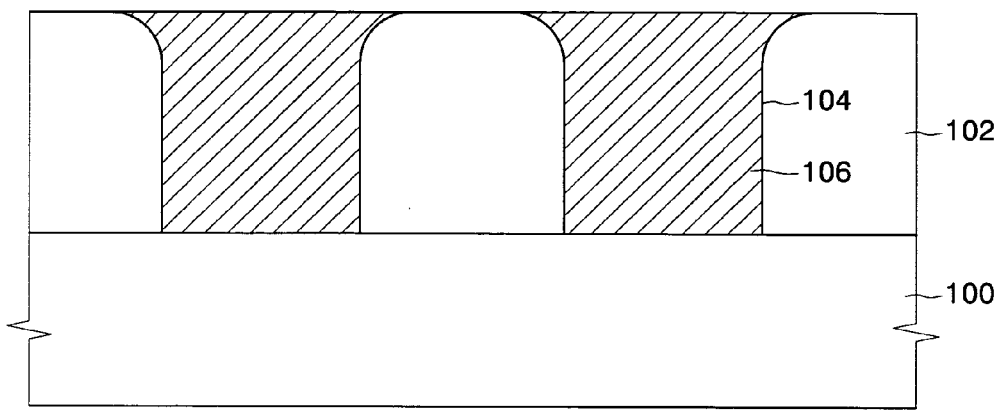
FIGS. 1 and 2 illustrate cross-sectional views of a conventional method of forming an interconnection line in a semiconductor device.
Figure 2:
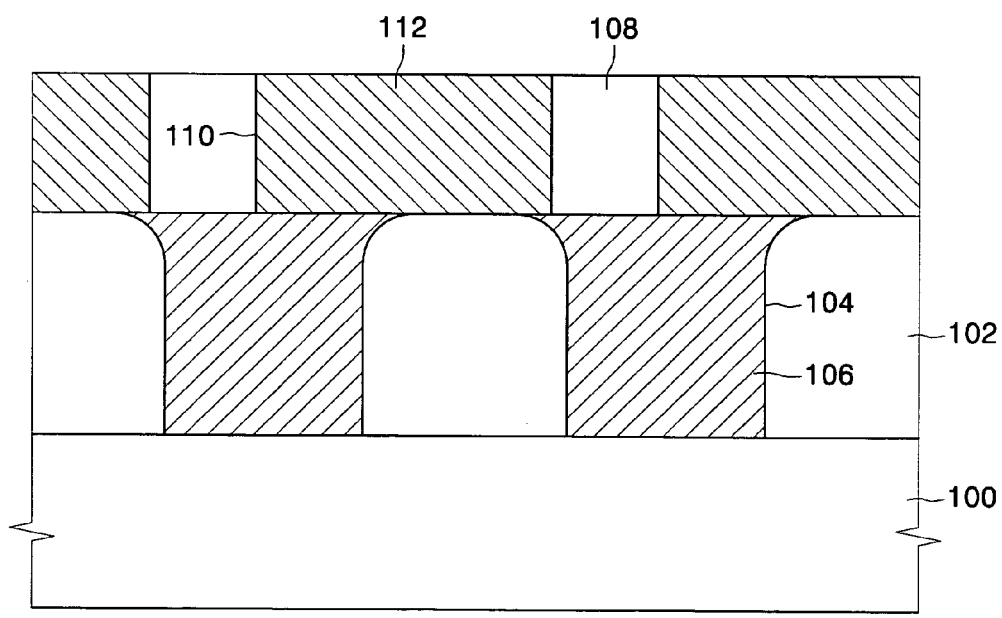

Korean Patent Application No. 2003-99115, filed on Dec. 29, 2003, in the Korean Intellectual Property Office, and entitled: "Method of Forming Interconnection Lines in Semiconductor Device," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals and characters refer to like elements throughout.

FIGS. 3 through 7 illustrate cross-sectional views of a method of forming an interconnection line in a semiconductor device according to a first embodiment of the present invention.

Figure 3:
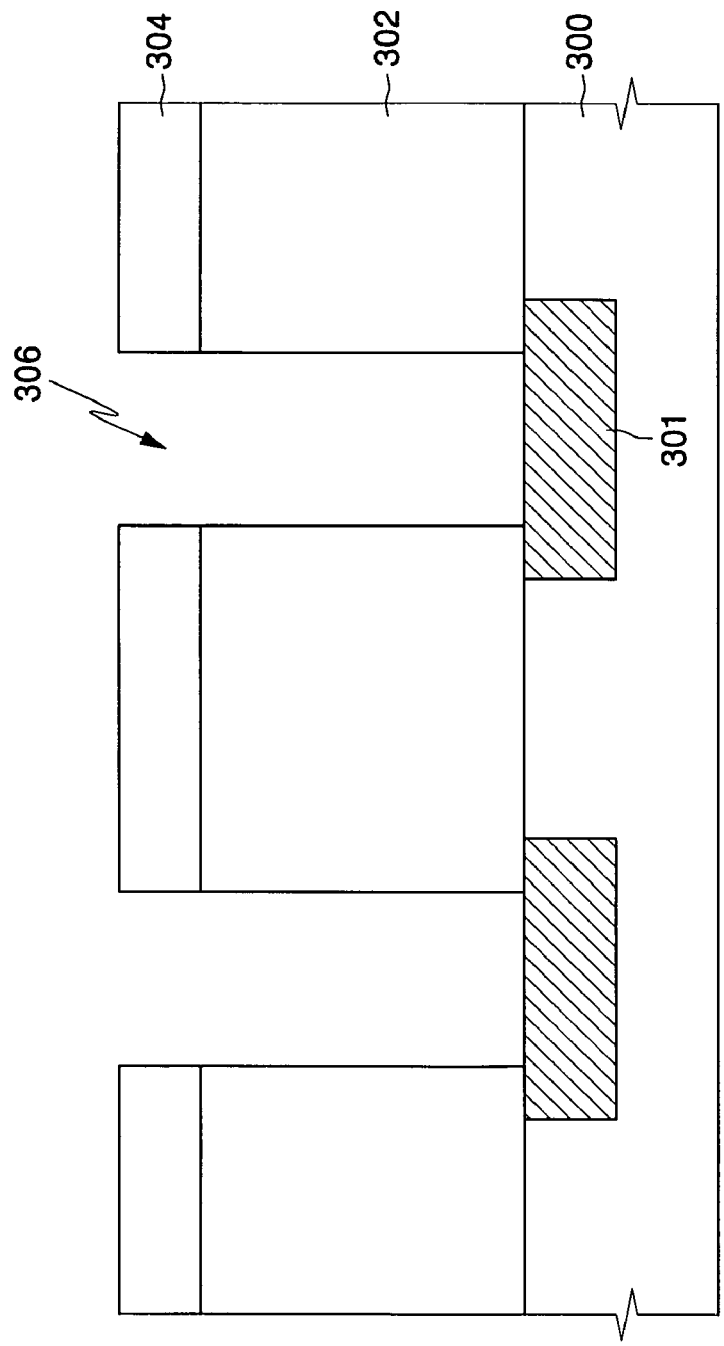
FIGS. 3 through 7 illustrate cross-sectional views of a method of forming an interconnection line in a semiconductor device according to a first embodiment of the present invention.

Referring to FIG. 3, an interlayer insulating layer 302 is formed on an underlying layer 300 including a lower conductive layer 301. The underlying layer 300 may be a semiconductor substrate or a lower interlayer insulating layer formed on a semiconductor substrate. The lower conductive layer 301 may be an impurity diffusion layer formed in an active region of a semiconductor substrate or a lower interconnection line formed in a lower interlayer insulating layer. The interlayer insulating layer 302 may be formed of an oxide layer having a low dielectric constant. For example, the interlayer insulating layer 302 may be formed of a borophosphosilicate glass (BPSG) layer deposited by a low pressure chemical vapor deposition (LPCVD) process, an undoped silicate glass (USG) layer, a carbon-doped silicon oxide (SiOC) layer, a spin on glass (SOG) layer, or other similar layer.

A photoresist pattern 304 is then formed on the interlayer insulating layer 302. Using the photoresist pattern 304 as an etch mask, the interlayer insulating layer 302 is anisotropically etched to form an opening 306 through which the lower conductive layer 301 is exposed. In this exemplary embodiment, the opening 306 can be a groove or a contact hole.

Figure 4:
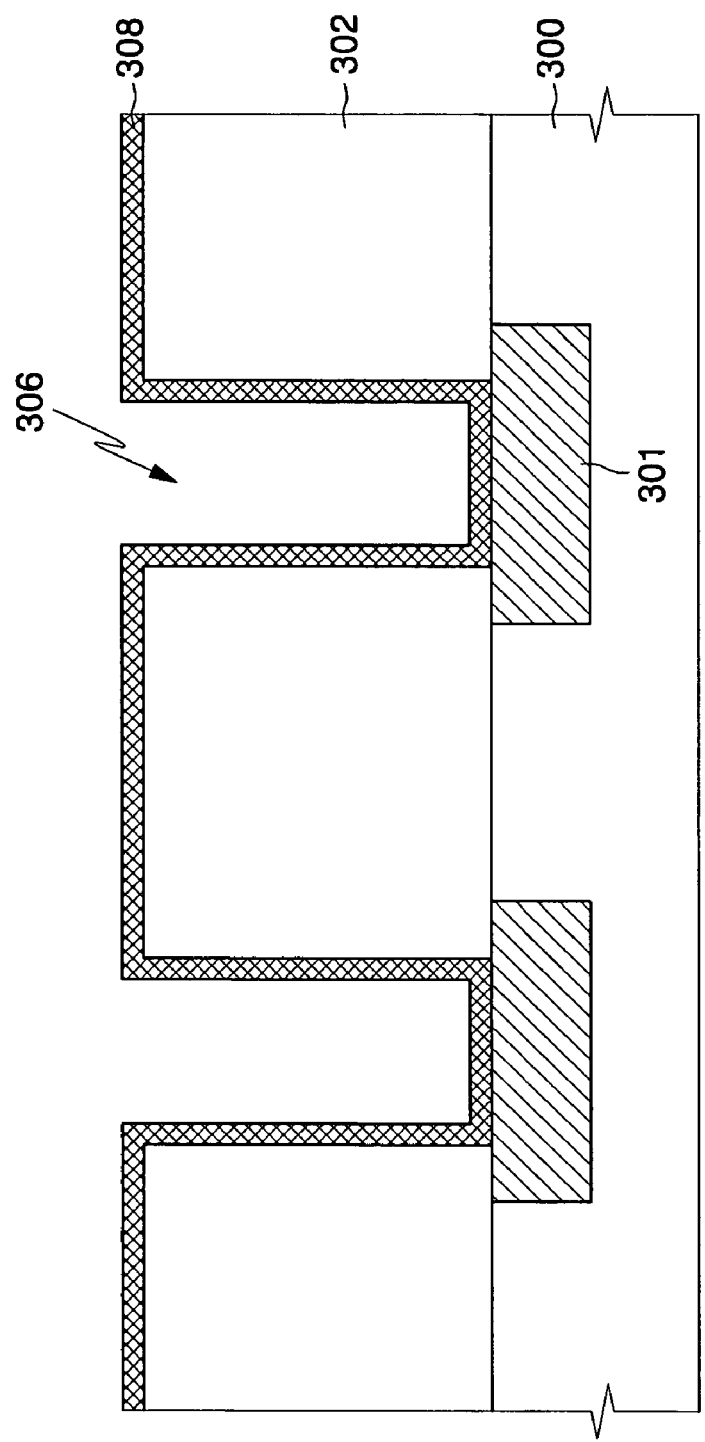

Referring to FIG. 4, the photoresist pattern 304 is removed by an ashing process. An additional material layer 308 is then conformally formed on the entire surface of the underlying layer 300 including sidewalls of the opening 306. The additional material layer 308 preferably has a lower wet etch rate than that of a silicon oxide layer used as the interlayer insulating layer 302. The additional material layer 308 may be formed of a silicon nitride (SiN or $Si_3N_4$) layer, a tantalum oxide ($Ta_2O_5$) layer, or other similar layer. When a silicon nitride layer is used as the additional material layer 308, the silicon nitride layer can be formed by an LPCVD process using dichlorosilane ($SiCl_2H_2$) and ammonia ($NH_3$) as reaction gases. Further, the additional material layer 308 preferably has a thickness of about 100 Å or less.

Figure 5:
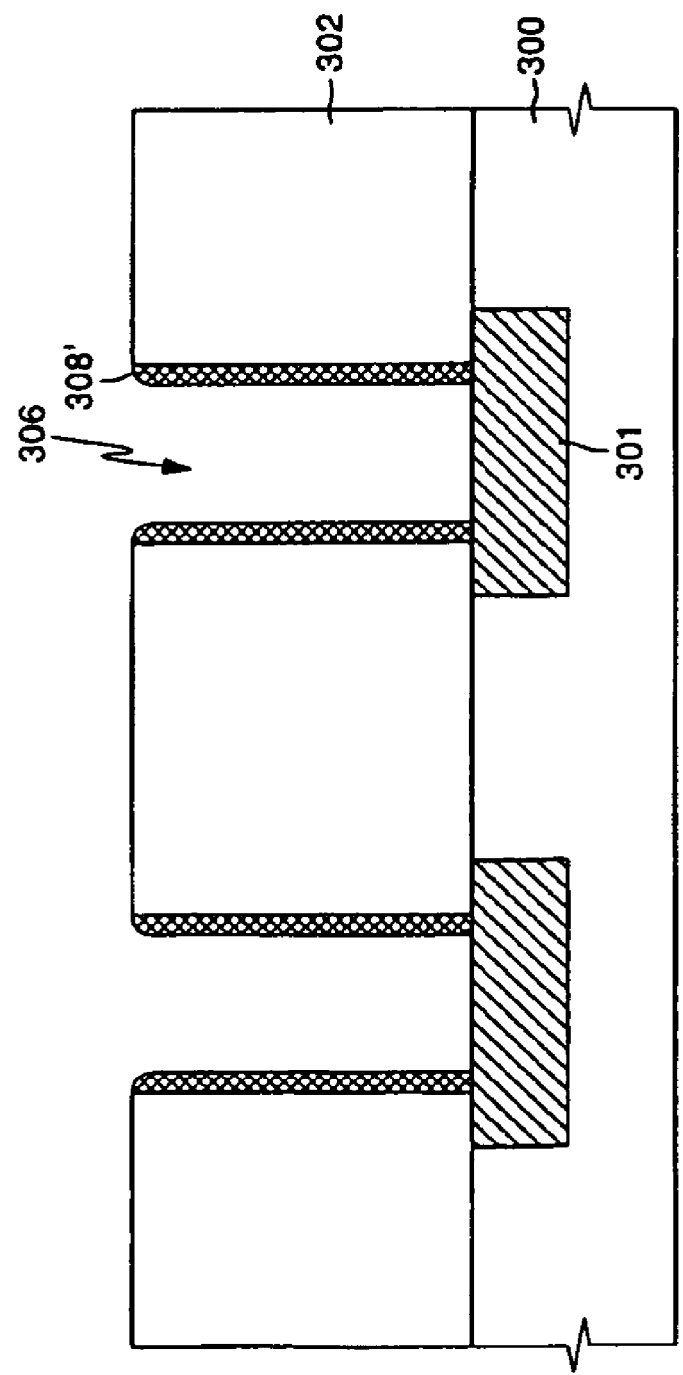

Referring to FIG. 5, the additional material layer 308, which is conformally formed on the underlying layer 300 having the opening 306, is anisotropically etched to form an opening spacer 308' covering sidewalls of the opening 306. The anisotropic etching can be separately performed to form the opening spacer 308'. Further, when a soft etching process is performed, the process of forming the opening spacer 308' can be incorporated into the soft etching process. The soft etching process may be performed to enhance electrical connection between a conductive layer pattern formed in the opening 306 and the lower conductive layer 301, and to remove foreign substances remaining on the lower conductive layer 301 after the anisotropic etching to form the opening 306. More specifically, the soft etching process is performed by the anisotropic etching to remove an upper surface of the lower conductive layer 301 exposed through the opening 306. Because the additional material layer 308 is formed to have a thickness of about 100 Å or less as described above, the process of forming the opening spacer 308' can be incorporated into the soft etching process without performing a separate anisotropic etching. Thus, according to an embodiment of the present invention, the opening 306 is first formed by a photolithography process and an etching process, and then the opening spacer 308' is formed to cover sidewalls of the opening 306. Therefore, a width of the opening 306 is decreased by the opening spacer 308', so that the photolithography process can be performed without difficulty even though interconnection lines have a small width.

After forming the opening spacer 308', a wet etch process is performed to remove a native oxide layer formed on a portion of the lower conductive layer 301 exposed through the opening 306 and the opening spacer 308'. The wet etch process may be performed using a chemical solution containing hydrogen fluoride (HF), e.g., a buffer oxide etchant (BOE), as an etchant. Meanwhile, the silicon nitride layer used as the opening spacer 308' has a lower etch rate than that of the silicon oxide layer used as the interlayer insulating layer 302. Therefore, during the wet etching, the opening spacer 308' acts as an etch mask for preventing etching of the interlayer insulating layer 302 forming the sidewall of the opening 306.

Figure 6:
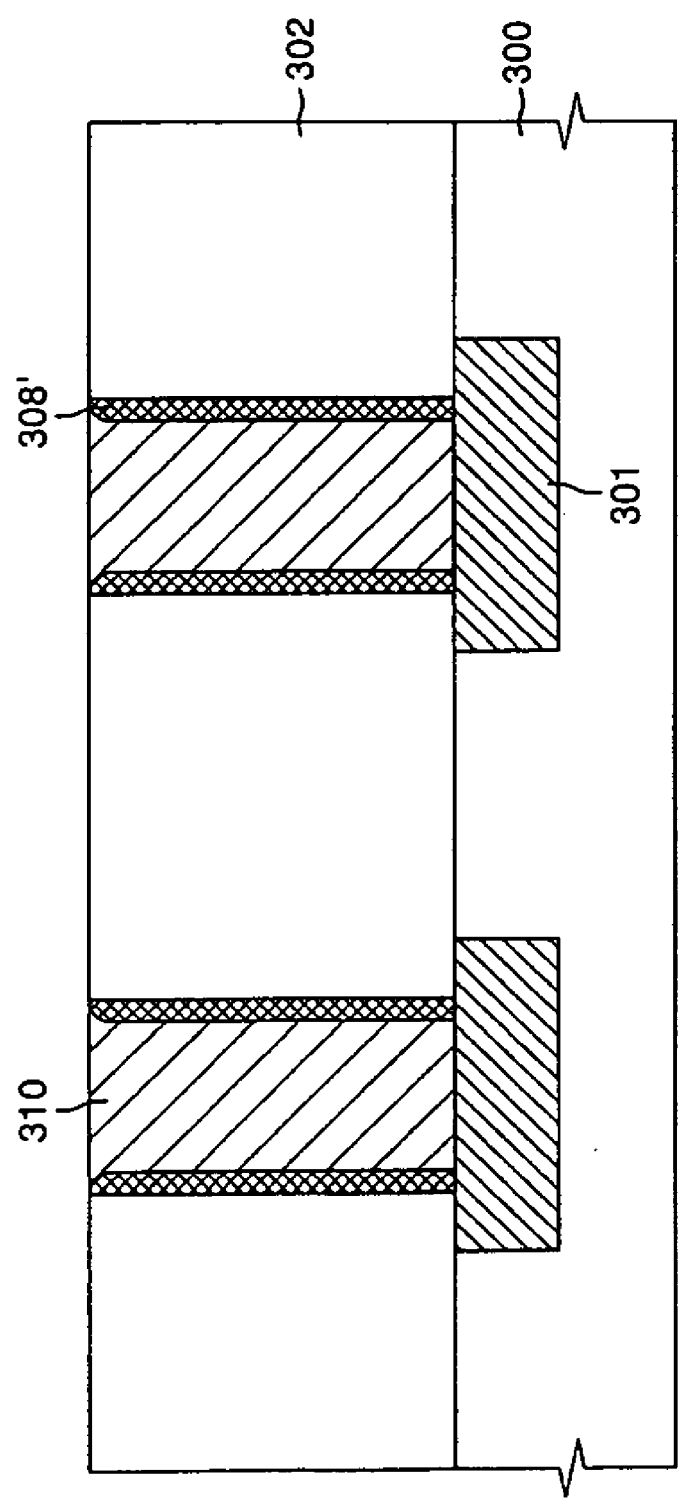

Referring to FIG. 6, after performing the wet etch process, a conductive layer (not shown) is formed on the entire surface of the interlayer insulating layer 302 having the opening 306 and the opening spacer 308' to fill a remaining portion of the opening 306 and covering the opening spacer 308'. The conductive layer may be formed of a tungsten layer or a polysilicon layer. The conductive layer is then planarized to expose the interlayer insulating layer 302, thereby forming a conductive layer pattern 310 in the opening 306. The conductive layer may be plarnarized by a CMP process. As described above, the opening spacer 308' prevents the interlayer insulating layer 302 forming the sidewall of the opening 306 from being etched during the wet etch process. Thus, the interlayer insulating layer 302 forming the sidewall of the opening 306 is not etched, thereby preventing formation of a short circuit between the conductive layer patterns 310.

Figure 7:
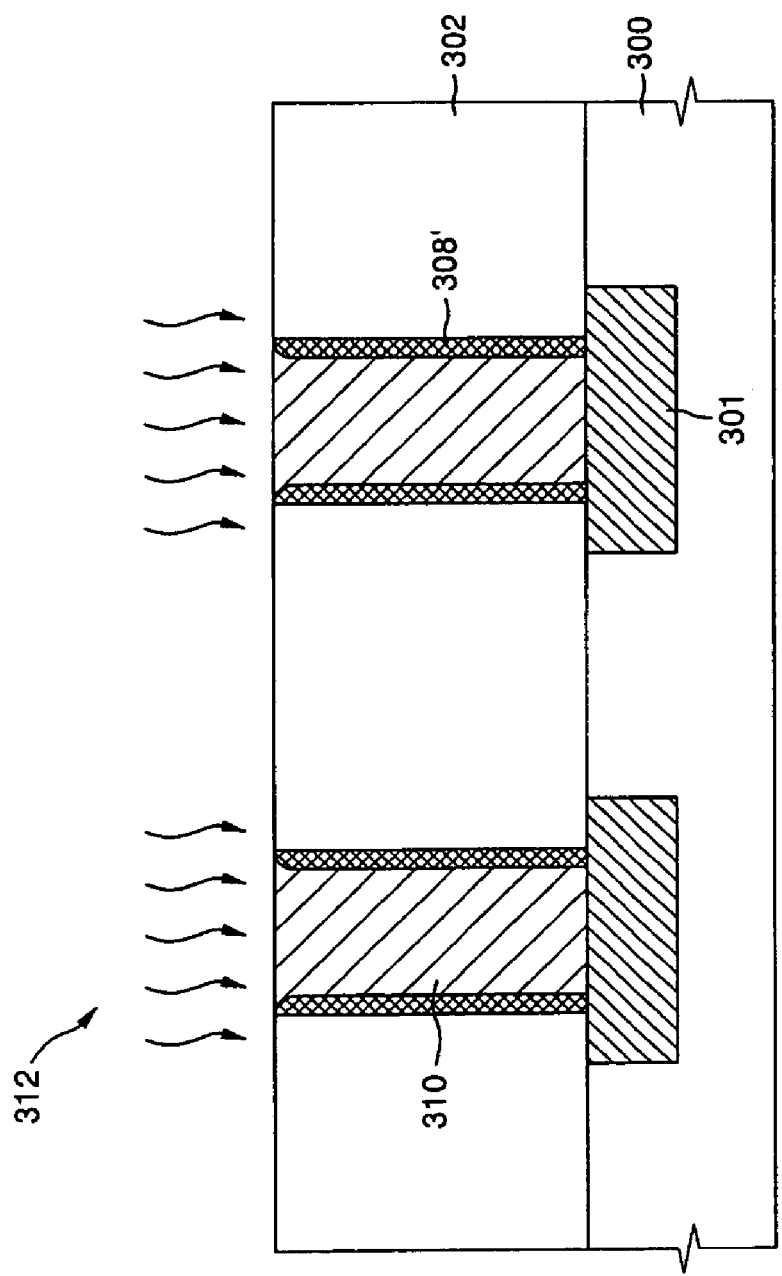

Referring to FIG. 7, after forming the conductive layer pattern 310, a heat treatment 312 is performed on the opening spacer 308'. The heat treatment 312 is preferably performed at a temperature of at least about 700° C., and more preferably, at a temperature of at least about 700° C. in an oxygen atmosphere. The silicon nitride layer forming the opening spacer 308' is oxidized from a boundary of a BPSG layer used as the interlayer insulating layer during the heat treatment process, thereby causing the silicon nitride layer to transform into a silicon oxynitride layer or a silicon oxide layer. In this case, the silicon nitride layer is formed to have a thickness of about 100 Å or less. Therefore, during the heat treatment 312, most of the silicon nitride layers are oxidized and transformed into the silicon oxynitride layer or the silicon oxide layer, thereby minimizing the thickness of the silicon nitride layer. Preferably, all of the silicon nitride layers are oxidized and transformed into the silicon oxynitride layer or the silicon oxide layer. As is generally known, the silicon oxynitride layer and the silicon oxide layer have dielectric constants of about seven and about four, respectively, so that they have a lower dielectric constant than the silicon nitride layer having a dielectric constant of about nine. Thus, according to the present invention, the thickness of the silicon nitride layer between the conductive layer patterns 310 is minimized, and all of the silicon nitride layers are oxidized and transformed into a silicon oxynitride layer or a silicon oxide layer, thereby minimizing a loading capacitance due to the silicon nitride layer used as the opening spacer 308'.

FIGS. 8 through 11 illustrate cross-sectional views of a method of forming an interconnection line in a semiconductor device according to a second embodiment of the present invention.

Figure 8:
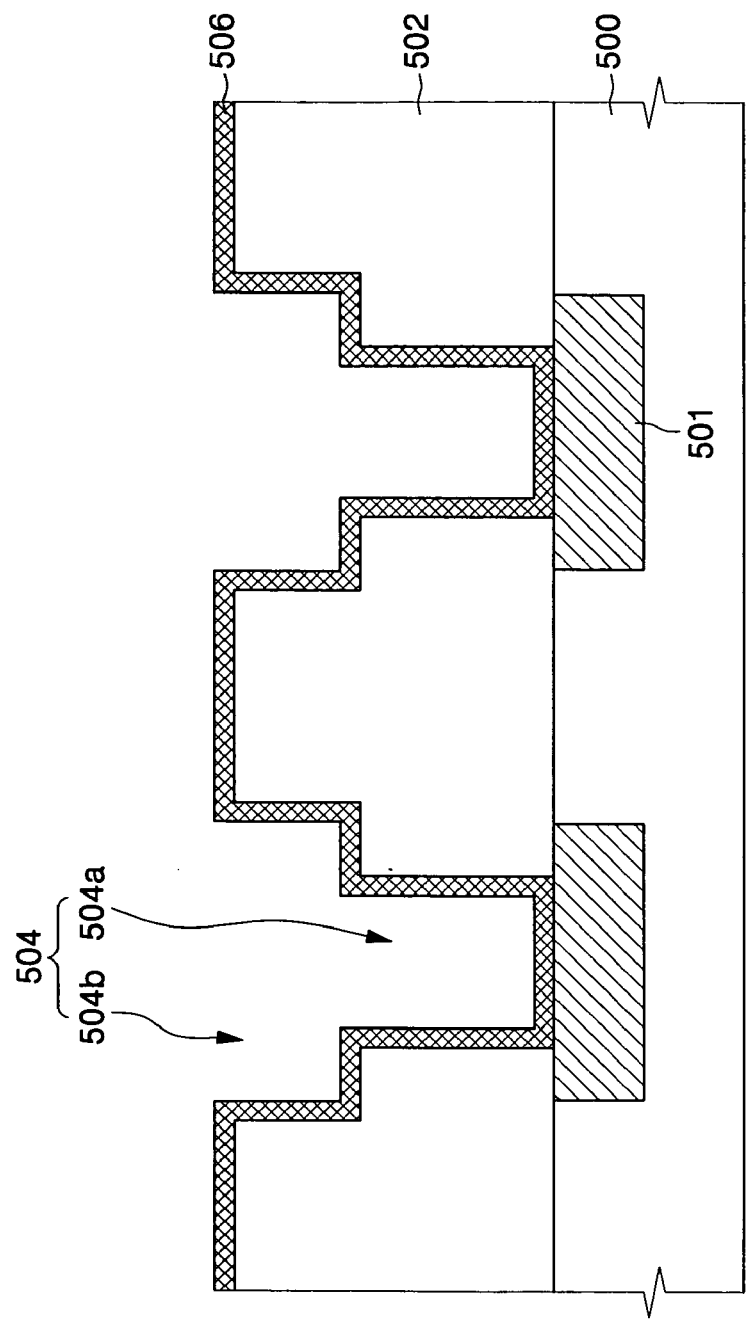
FIGS. 8 through 11 illustrate cross-sectional views of a method of forming an interconnection line in a semiconductor device according to a second embodiment of the present invention.

Referring to FIG. 8, an interlayer insulating layer 502 is formed on an underlying layer 500 including a lower conductive layer 501. The underlying layer 500 may be a semiconductor substrate or a lower interlayer insulating layer formed on a semiconductor substrate. The lower conductive layer 501 can be an impurity diffusion layer formed in an active region of a semiconductor substrate or a lower interconnection line formed in a lower interlayer insulating layer. The interlayer insulating layer 502 may be formed of an oxide layer having a low dielectric constant. For example, the interlayer insulating layer 502 may be formed of a borophosphosilicate glass (BPSG) layer deposited by a low pressure chemical vapor deposition (LPCVD) process, an undoped silicate glass (USG) layer, a carbon-doped silicon oxide (SiOC) layer, a spin on glass (SOG) layer, or other similar layer. The interlayer insulating layer 502 is then patterned to form a dual damascene pattern 504 therein through which the lower conductive layer 501 is exposed. The dual damascene pattern 504 may be formed by a via-first method. More specifically, the interlayer insulating layer 502 is first patterned to form a via hole 504a through which the lower conductive layer 501 is exposed, and then the interlayer insulating layer 502 having the via hole 504a is second patterned to form a trench 504b at least overlapping the via hole 504a.

An additional material layer 506 is then conformally formed on the entire surface of the underlying layer 500 including the dual damascene pattern 504. The additional material layer 506 preferably has a lower wet etch rate than that of a silicon oxide layer used as the interlayer insulating layer 502. The additional material layer 506 may include a silicon nitride (SiN or $Si_3N_4$) layer. Further, the additional material layer 506 preferably has a thickness of about 100 Å or less.

Figure 9:
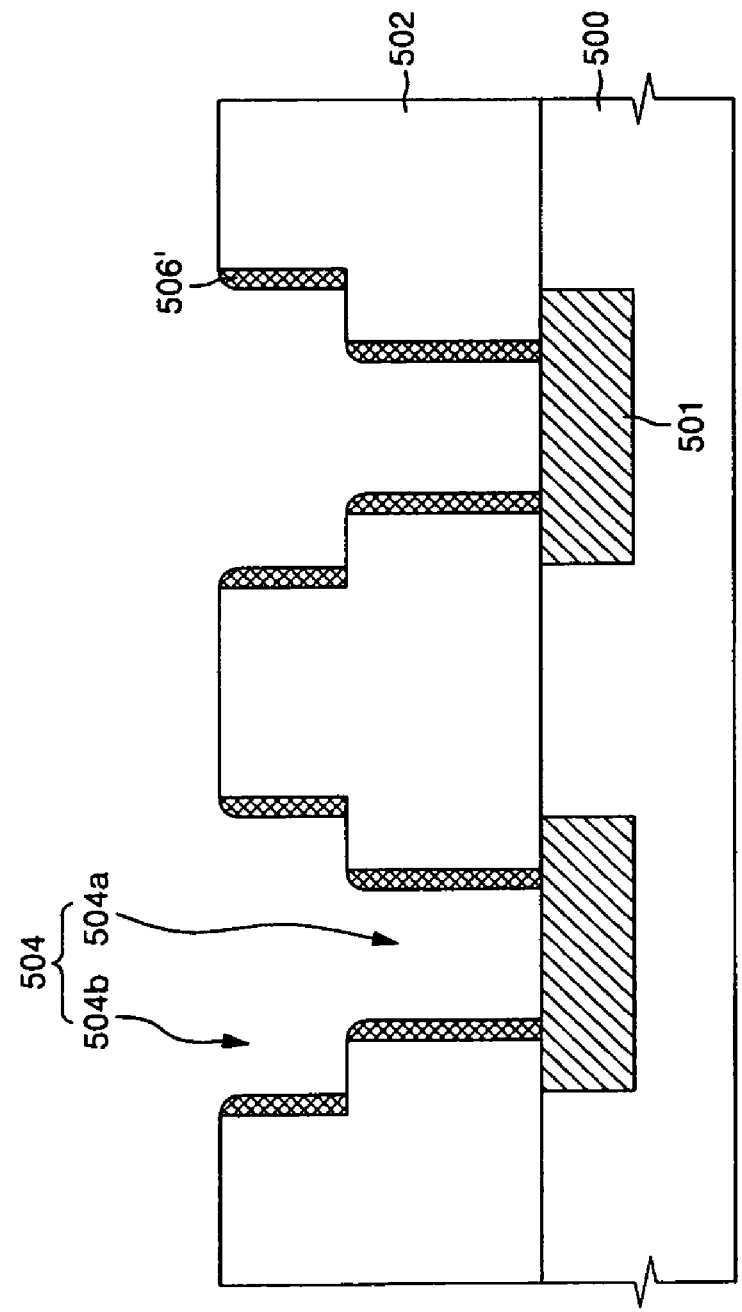

Referring to FIG. 9, the additional material layer 506 is anisotropically etched to form a pattern spacer 506' covering sidewalls of the dual damascene pattern 504. As described in connection with the first embodiment, the anisotropic etching can be separately performed to form the pattern spacer 506' or incorporated into a soft etching process. After forming the pattern spacer 506', a wet etch process is performed to remove a native oxide layer formed on a portion of the lower conductive layer 501 exposed through the dual damascene pattern 504 and the pattern spacer 506'. The wet etch process can be performed using a chemical solution containing hydrogen fluoride (HF), e.g., a buffer oxide echant (BOE), as an etchant. During the wet etch process, the pattern spacer 506' acts as an etch mask for preventing the interlayer insulating layer 502 forming the sidewalls of the dual damascene pattern 504 from being etched.

Figure 10:
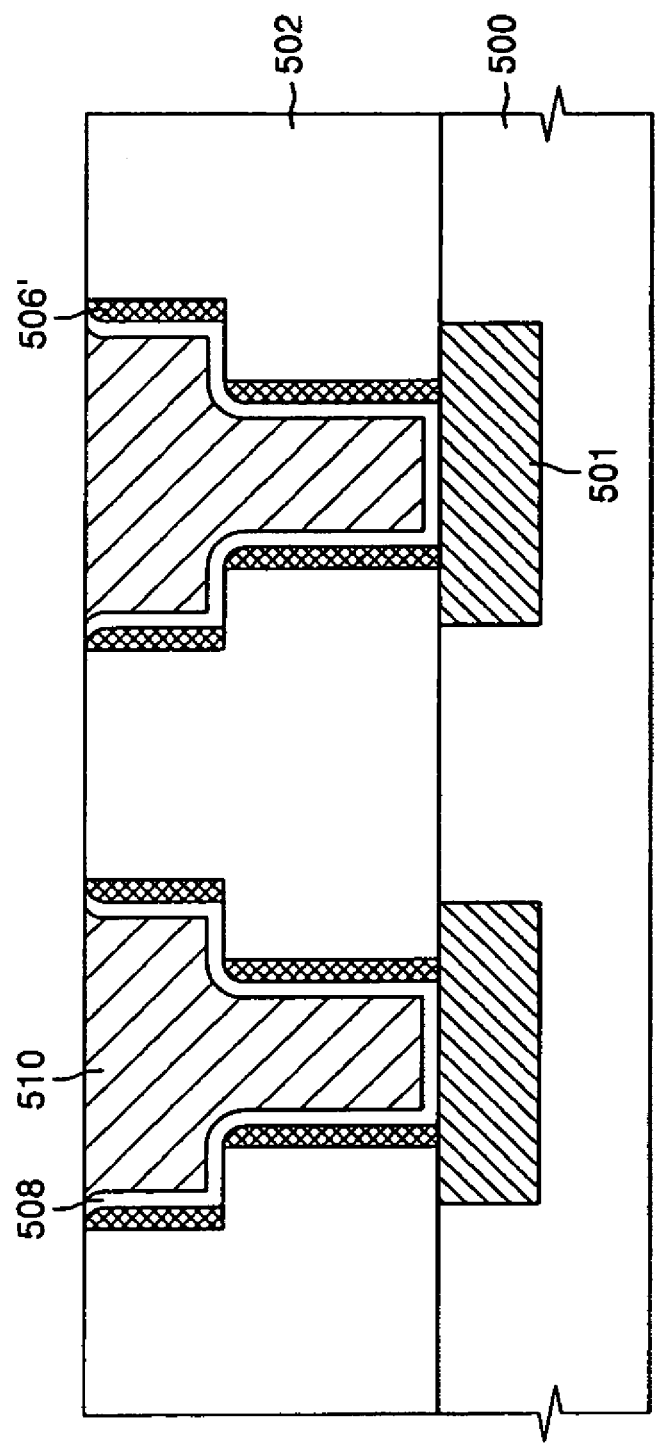

Referring to FIG. 10, after performing the wet etch process, a conductive layer (not shown) is formed on the entire surface of the underlying layer to fill a remaining portion of the dual damascene pattern 504 and covering the pattern spacer 506'. The conductive layer may be a copper layer. A diffusion barrier (not shown) may preferably be conformally formed on the entire surface of the underlying layer before forming the copper layer. The diffusion barrier may be formed of a tantalum (Ta) layer, tantalum nitride (TaN) layer, titanium (Ti) layer, titanium nitride (TiN) layer or a combination layer thereof. The conductive layer and the diffusion barrier are then planarized to expose the interlayer insulating layer 502, thereby forming a diffusion barrier pattern 508 and a conductive layer pattern 510 in the dual damascene pattern 504. The conductive layer and the diffusion barrier can be planarized by a CMP process.

Figure 11:
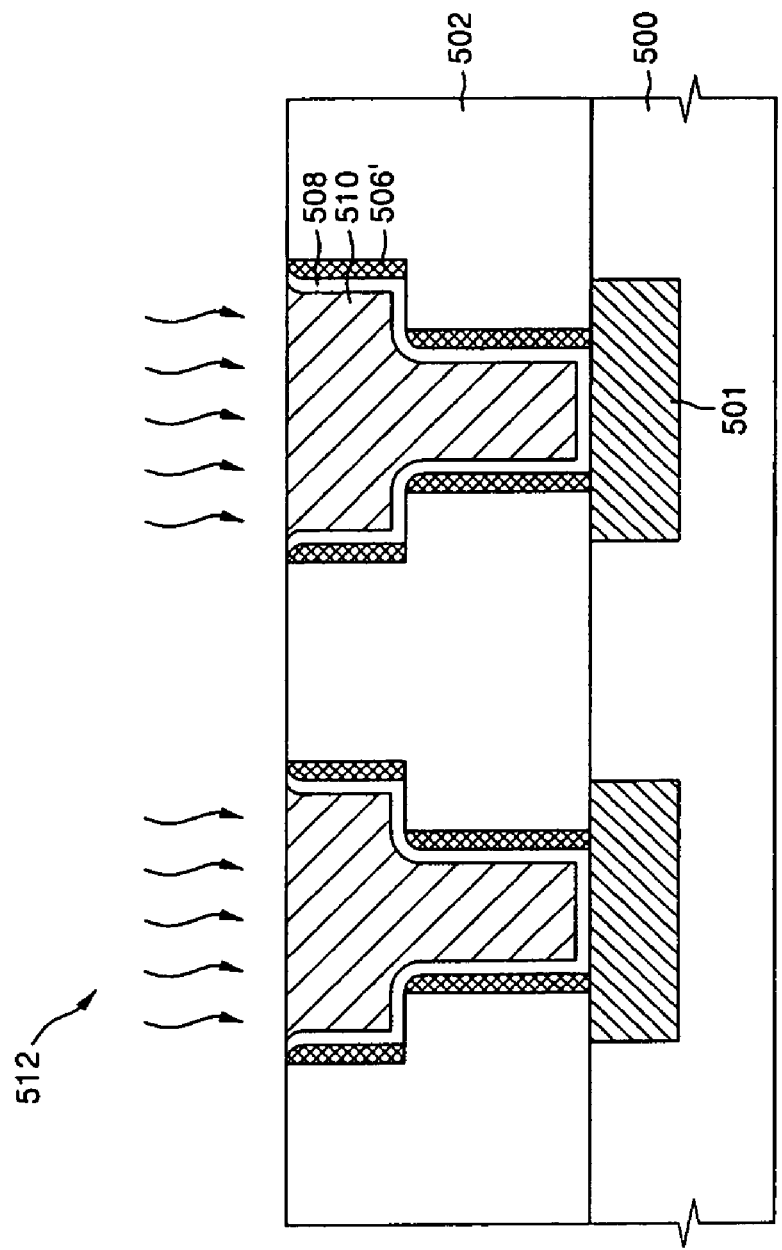

Referring to FIG. 11, after forming the conductive layer pattern 510, a heat treatment 512 is performed on the pattern spacer 506'. Similar to the first embodiment, the heat treatment 512 is preferably performed at a temperature of at least about 700° C., and more preferably, at a temperature of at least about 700° C. in an oxygen atmosphere. Thus, the thickness of the silicon nitride layer used as the pattern spacer 506' is minimized, and all of the silicon nitride layers are preferably oxidized and transformed into a silicon oxynitride layer or a silicon oxide layer, thereby minimizing a loading capacitance due to the silicon nitride layer used as the pattern spacer 506'.

As described above, the present invention provides a method of forming an interconnection line in a semiconductor device, in which sidewalls of an opening for an interconnection line are formed with an opening spacer, a photolithography process can be performed without difficulty even though interconnection lines have a small width. In addition, the opening spacer prevents an insulating layer forming the sidewall of the opening used for the interconnection line from being etched, thereby preventing formation of a short circuit between interconnection lines. Further, performance of a heat treatment on the opening spacer prevents a loading capacitance of the semiconductor device from being increased due to the opening spacer.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming an interconnection line in a semiconductor device, comprising:
    forming an interlayer insulating layer on an underlying layer having a lower conductive layer;
    patterning the interlayer insulating layer to form an opening exposing the lower conductive layer;
    forming an additional material layer conformally on the underlying layer including the opening;
    anisotropically etching the additional material layer to form an opening spacer covering a sidewall of the opening;
    performing a wet etch process using the opening spacer as an etch mask;
    forming a conductive layer pattern in the opening; and
    performing a heat treatment on the opening spacer, wherein the heat treatment is performed at a temperature of at least about 700° C.

2. The method as claimed in claim 1, wherein the interlayer insulating layer is a dielectric layer having a low dielectric constant.

3. The method as claimed in claim 1, wherein the interlayer insulating layer is a borophosphosilicate glass (BPSG) layer.

4. The method as claimed in claim 1, wherein the additional material layer is formed of material layer having a lower etch rate than that of the interlayer insulating layer.

5. The method as claimed in claim 1, wherein the additional material layer is a silicon nitride layer.

6. The method as claimed in claim 1, wherein the additional material layer is formed to have a thickness of about 100 Å or less.

7. The method as claimed in claim 1, wherein the heat treatment is performed at a temperature of at least about 700° C. in an oxygen atmosphere.

8. The method as claimed in claim 1, wherein the conductive layer pattern is formed of tungsten or polysilicon.

9. The method as claimed in claim 1, wherein forming the conductive layer pattern comprises:
    forming a conductive layer to fill the opening after performing the wet etch process; and
    planarizing the conductive layer to expose the interlayer insulating layer.

10. The method as claimed in claim 1, wherein the opening is a contact hole or a groove.

11. The method as claimed in claim 1, wherein the opening is a dual damascene pattern and the additional material layer is conformally formed on the underlying layer including the dual damascene pattern.

12. The method as claimed in claim 11, wherein the interlayer insulating layer is a dielectric layer having a low dielectric constant.

13. The method as claimed in claim 11, wherein the interlayer insulating layer is a borophosphosilicate glass (BPSG) layer.

14. The method as claimed in claim 11, wherein the additional material layer is formed of a material layer having a lower etch rate than that of the interlayer insulating layer.

15. The method as claimed in claim 11, wherein the additional material layer is a silicon nitride layer.

16. The method as claimed in claim 11, wherein the additional material layer is formed to have a thickness of about 100 Å or less.

17. The method as claimed in claim 11, wherein the heat treatment is performed at a temperature of at least about 700° C. in an oxygen atmosphere.

18. A method of forming a semiconductor device, comprising:
    providing a substrate having a first conductive feature therein;
    patterning a insulating layer on the substrate so as to form an opening exposing the conductive feature;
    depositing a first material layer along sidewalls of the opening, the first material layer having a first dielectric constant;
    performing a first etch process on the substrate, wherein the insulating layer is susceptible to the first etch process and the first material layer protects sidewalls of the opening against the first etch process;
    depositing a conductive material in the opening so as to form a second conductive feature in electrical contact with the first conductive feature; and
    converting at least a portion of the first material layer to a second material, the second material having a second dielectric constant lower than the first dielectric constant.

19. The method as claimed in claim 18, wherein the first material layer is a silicon nitride material layer and the second material is silicon oxynitride or silicon oxide.

20. The method as claimed in claim 18, wherein converting at least a portion of the first material layer to the second material includes oxidizing the first material layer.

21. The method as claimed in claim 20, wherein converting at least a portion of the first material layer to the second material includes heating the first material layer to a temperature greater than about 700° C.

22. The method as claimed in claim 21, wherein converting at least a portion of the first material layer to the second material includes heating the first material layer to a temperature greater than about 700° C. in an oxygen atmosphere.

* * * * *